(12) United States Patent
Suewaka

(10) Patent No.: US 10,920,339 B2
(45) Date of Patent: Feb. 16, 2021

(54) SILICON SINGLE CRYSTAL PULLING CONDITION CALCULATION PROGRAM, SILICON SINGLE CRYSTAL HOT ZONE IMPROVEMENT METHOD, AND SILICON SINGLE CRYSTAL GROWING METHOD

(71) Applicant: SUMCO CORPORATION, Tokyo (JP)

(72) Inventor: Ryota Suewaka, Fukuoka (JP)

(73) Assignee: SUMCO CORPORATION, Tokyo (JP)

( * ) Notice: Subject to any disclaimer, the term of this patent is extended or adjusted under 35 U.S.C. 154(b) by 56 days.

(21) Appl. No.: 16/475,398

(22) PCT Filed: Dec. 7, 2017

(86) PCT No.: PCT/JP2017/044012
§ 371 (c)(1),
(2) Date: Jul. 2, 2019

(87) PCT Pub. No.: WO2018/128046
PCT Pub. Date: Jul. 12, 2018

(65) Prior Publication Data
US 2019/0330760 A1    Oct. 31, 2019

(30) Foreign Application Priority Data
Jan. 5, 2017 (JP) .................................. 2017-000677

(51) Int. Cl.
*C30B 15/20* (2006.01)
*C30B 15/22* (2006.01)
*C30B 29/06* (2006.01)

(52) U.S. Cl.
CPC .............. *C30B 15/22* (2013.01); *C30B 29/06* (2013.01)

(58) Field of Classification Search
CPC ......... C30B 5/20; C30B 15/206; C30B 15/22; C30B 29/06; G05B 19/00
See application file for complete search history.

(56) References Cited

U.S. PATENT DOCUMENTS 5,868,831 A * 2/1999 Dornberger ............. C30B 13/28
117/15
5,968,263 A * 10/1999 Grover .................... C30B 15/14
117/14

(Continued)

FOREIGN PATENT DOCUMENTS

CN           1738930 A       2/2006
CN          101302646       10/2011
(Continued)

OTHER PUBLICATIONS

F. Dupret et al., "Global Modelling of Heat Transfer in Crystal Growth Furnaces", Int. Journal of Heat and Mass Transfer. vol. 33 No. 9, Apr. 7, 1989, pp. 1849-1871,1990.

(Continued)

*Primary Examiner* — Robert M Kunemund
(74) *Attorney, Agent, or Firm* — Greenblum & Bernstein, P.L.C.

(57) ABSTRACT

A pulling condition calculation program enables a computer to perform the steps of: setting a plurality of sets of pulling conditions based on solid-liquid interface height and distance between a surface of a silicon melt and a heat shield plate; performing, for each set of the pulling conditions, the steps of: calculating a heat flux (q) (W/m$^2$) and a crystal surface temperature (T); defining a reference temperature (Tref) given by an equation (1) below and a geometry of the solid-liquid interface as boundary conditions, recalculating an in-crystal temperature distribution; calculating a mean stress in the monocrystalline silicon; calculating a defect distribution in a pulling direction based on the mean stress and the in-crystal temperature distribution; determining a defect-free region in the pulling direction; and drawing a contour line showing a dimension of the defect-free region on a two-dimensional map defined by the distance and the solid-liquid interface height.

(Continued)

$$Tref = \sqrt[4]{T^4 - \frac{q}{\varepsilon\sigma}} \quad (1)$$

4 Claims, 8 Drawing Sheets

(56) References Cited

U.S. PATENT DOCUMENTS

| | | | |
|---|---|---|---|
| 2003/0041796 A1 | 3/2003 | Nakamura et al. | |
| 2006/0005761 A1* | 1/2006 | Kulkarni | C30B 15/22 |
| | | | 117/15 |
| 2006/0144320 A1* | 7/2006 | Korb | C30B 15/305 |
| | | | 117/15 |
| 2006/0191469 A1 | 8/2006 | Fu et al. | |
| 2007/0218570 A1* | 9/2007 | Nakamura | H01L 21/3225 |
| | | | 438/5 |
| 2007/0227439 A1 | 10/2007 | Yokoyama et al. | |
| 2008/0187736 A1 | 8/2008 | Sattler et al. | |
| 2010/0031870 A1* | 2/2010 | Sreedharamurthy | C30B 29/06 |
| | | | 117/15 |
| 2016/0194785 A1* | 7/2016 | Stoddard | C30B 11/001 |
| | | | 428/156 |

FOREIGN PATENT DOCUMENTS

| | | |
|---|---|---|
| CN | 105765114 A | 7/2016 |
| EP | 1 270 769 | 11/2010 |
| JP | H5-319974 A | 12/1993 |
| JP | 2001-261495 | 9/2001 |
| JP | 2006-225194 | 8/2006 |
| JP | 2007-261846 | 10/2007 |
| JP | 2010-275170 | 12/2010 |
| JP | 4819833 | 11/2011 |
| JP | 5120337 | 1/2013 |
| KR | 10-2016-0095040 A | 8/2016 |
| TW | 201636465 | 10/2016 |
| WO | WO 01/71069 A1 | 9/2001 |

OTHER PUBLICATIONS

International Search Report issused in International Patent Application No. PCT/JP2017/044012, dated Mar. 6, 2018.
Notification of Reasons for Refusal (Office Action) in Taiwanese Counterpart Patent Appl. No. 106137091, dated Jul. 27, 2018, along with an English translation thereof.
International Preliminary Report on Patentability for International Patent Application No. PCT/JP2017/044012, dated Jul. 9, 2019.
Office Action for CN App. No. 201780082253.X, dated Sep. 8, 2020 (w/ translation).
Li Liangbi, ed. "Ship structure fatigue strength and welding residual stress", pp. 64-75, 2014.
Notice of Allowance for KR App. No. 10-2019-7021840, dated Sep. 28, 2020 (w/ partial translation).

* cited by examiner

SILICON SINGLE CRYSTAL PULLING CONDITION CALCULATION PROGRAM, SILICON SINGLE CRYSTAL HOT ZONE IMPROVEMENT METHOD, AND SILICON SINGLE CRYSTAL GROWING METHOD

TECHNICAL FIELD

The present invention relates to a monocrystalline silicon pulling condition calculation program, a hot zone improvement method for a monocrystalline silicon, and a monocrystalline silicon growing method.

BACKGROUND ART

Proposed conventional monocrystalline silicon growing methods as proposed include a defect-free monocrystalline silicon growing method considering a stress effect on the inside of a monocrystalline silicon (see, for instance, Patent Literature 1).

According to a method described in Patent Literature 1, a V/G profile is controlled to compensate an effect of a thermomechanical stress field in a monocrystal, which borders an interface, for occurrence of an inherent point defect. Incidentally, V denotes a pulling velocity and G denotes a temperature gradient in a growth-axial direction.

CITATION LIST

Patent Literature(s)

Patent Literature 1 Japanese Patent No. 4819833

SUMMARY OF THE INVENTION

Problem(s) to be Solved by the Invention

Although a technique according to Patent Literature 1 provides a method of controlling the V/G profile, specific hot zone geometry and interface geometry for controlling the V/G profile are unknown.

Besides, the interface geometry according to Patent Literature 1, which is determined by numerical analysis, is not always the same as the actual solid-liquid interface geometry, so that the method is not capable of designing a hot zone and setting optimal pulling conditions for the hot zone.

An object of the invention is to provide a monocrystalline silicon pulling condition calculation program, a hot zone improvement method for a monocrystalline silicon, and a monocrystalline silicon growing method that are capable of determining conditions that provide a maximum defect-free region for each hot zone geometry.

Means for Solving the Problem(s)

A feature of the invention is that a reference temperature given by an equation (1) below and a geometry of a solid-liquid interface are introduced as boundary conditions to determine optimal pulling conditions.

According to an aspect of the invention, a monocrystalline silicon pulling condition calculation program for determining, for growth of a monocrystalline silicon, an optimal value of a solid-liquid interface height h of a solid-liquid interface and an optimal value of a distance Gap between a heat shield plate of a pull-up apparatus for the monocrystalline silicon and a surface of a silicon melt is configured to enable a computer to perform the steps of:

setting a plurality of sets of pulling conditions based on a plurality of values of the solid-liquid interface height h and a plurality of values of the distance Gap between the heat shield plate and the surface of the silicon melt;

performing, for each set of the pulling conditions, the steps of: calculating a heat flux q (W/m$^2$) and a crystal surface temperature T(K) in the pull-up apparatus by global heat transfer analysis; defining a reference temperature Tref(K) and a geometry of the solid-liquid interface as boundary conditions, the reference temperature Tref(K) being given by an equation (1) below based on the calculated heat flux q(W/m$^2$) and crystal surface temperature T(K); recalculating an in-crystal temperature distribution in the monocrystalline silicon based on the defined boundary conditions; calculating a mean stress σmean caused in the monocrystalline silicon by structure analysis based on the recalculated in-crystal temperature distribution in the monocrystalline silicon; calculating a defect distribution in a pulling direction in the monocrystalline silicon based on the calculated mean stress σmean in the monocrystalline silicon and the recalculated in-crystal temperature distribution in the monocrystalline silicon; and determining a defect-free region in the pulling direction in the monocrystalline silicon based on the calculated defect distribution in the pulling direction in the monocrystalline silicon;

drawing a contour line of the defect-free region on a two-dimensional map based on a dimension of the defect-free region in the pulling direction in the monocrystalline silicon for each set of the pulling conditions, the two-dimensional map being defined by the distance Gap between the heat shield plate and the surface of the silicon melt and the solid-liquid interface height h; and selecting, based on the contour line drawn on the two-dimensional map, one of the values of the solid-liquid interface height h and one of the values of the distance Gap between the heat shield plate and the surface of the silicon melt that maximize the dimension of the defect-free region.

The mean stress σmean is given by σmean=(σrr+σθθ+σzz)/3, in which σrr, σθθ, and σzz represent stress components perpendicular to r-plane, θ-plane, and z-plane, respectively.

Equation 1

$$Tref = \sqrt[4]{T^4 - \frac{q}{\varepsilon\sigma}} \qquad (1)$$

In the equation,

ε=0.55: emissivity of the monocrystalline silicon, and
σ=5.67×10$^{-8}$ (W/m$^2$/K$^4$): Stefan-Boltzmann coefficient.

According to another aspect of the invention, a hot zone improvement method for a monocrystalline silicon includes: with use of the above monocrystalline silicon pulling condition calculation program, calculating by computer the pulling conditions of the monocrystalline silicon for each of respective geometries of a plurality of hot zones; calculating the defect-free region corresponding to each of the hot zones; and selecting optimal one of the hot zones that provides a maximum defect-free region.

In the above aspects, the in-crystal temperature distribution of the monocrystalline silicon is calculated with the reference temperature for each set of the pulling conditions as set and the mean stress in the monocrystalline silicon is calculated based on the calculated in-crystal temperature distribution. The point defect distribution is then calculated based on the highly accurate in-crystal temperature distribution and mean stress effect to find the maximum one of defect-free regions, the contour lines of which are drawn on the two-dimensional map defined by the distance Gap between the heat shield plate and the liquid surface and the solid-liquid interface height h. Consequently, based on the contour lines drawn on the two-dimensional map, the value of the solid-liquid interface height h and the value of the distance Gap between the heat shield plate and the liquid surface are selected that provide the maximum defect-free region, thus determining the optimal pulling conditions.

According to still another aspect of the invention, a monocrystalline silicon growing method for growing a monocrystalline silicon includes:

with use of the above monocrystalline silicon pulling condition calculation program, calculating by computer the pulling conditions of the monocrystalline silicon; and pulling up the monocrystalline silicon based on the calculated optimal value of the solid-liquid interface height h and optimal value of the distance (lap between the heat shield plate and the surface of the silicon melt.

According to yet another aspect of the invention, a monocrystalline silicon growing method for growing a monocrystalline silicon includes:

based on the above hot zone improvement method of a monocrystalline silicon, calculating the pulling conditions of the monocrystalline silicon for each of the respective geometries of the plurality of hot zones; and pulling up the monocrystalline silicon based on the calculated optimal value of the solid-liquid interface height h and optimal value of the distance Gap between the heat shield plate and the surface of the silicon melt.

In the above aspects, using the monocrystalline silicon pulling condition calculation program or the hot zone improvement method, the optimal value of the solid-liquid interface height h and the optimal value of the distance Gap between the heat shield plate and the liquid surface are selected to pull up the monocrystalline silicon. The monocrystalline silicon is thus stably grown with less influence of a pulling velocity of the monocrystalline silicon.

BRIEF DESCRIPTION OF DRAWING(S)

FIG. 1 schematically shows a configuration of a monocrystalline silicon pull-up apparatus according to an exemplary embodiment of the invention.

Figure 4:
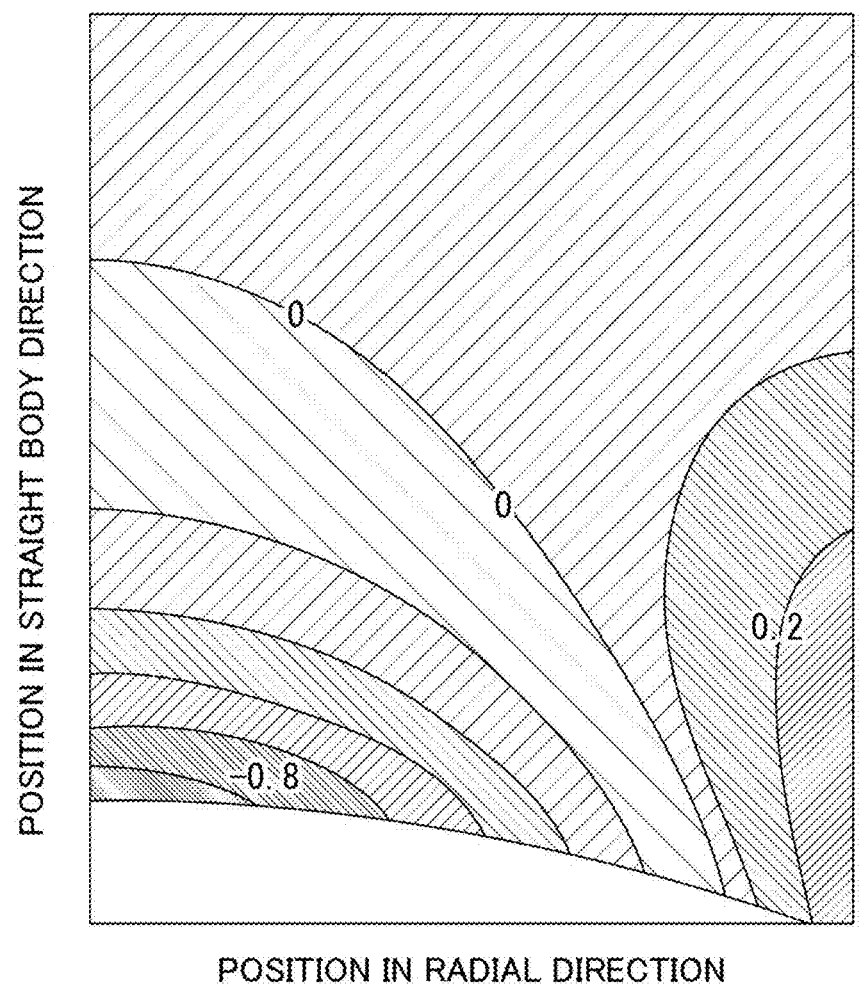

FIG. 4 schematically shows distribution of mean stress in the monocrystalline silicon according to the exemplary embodiment.

Figure 5:
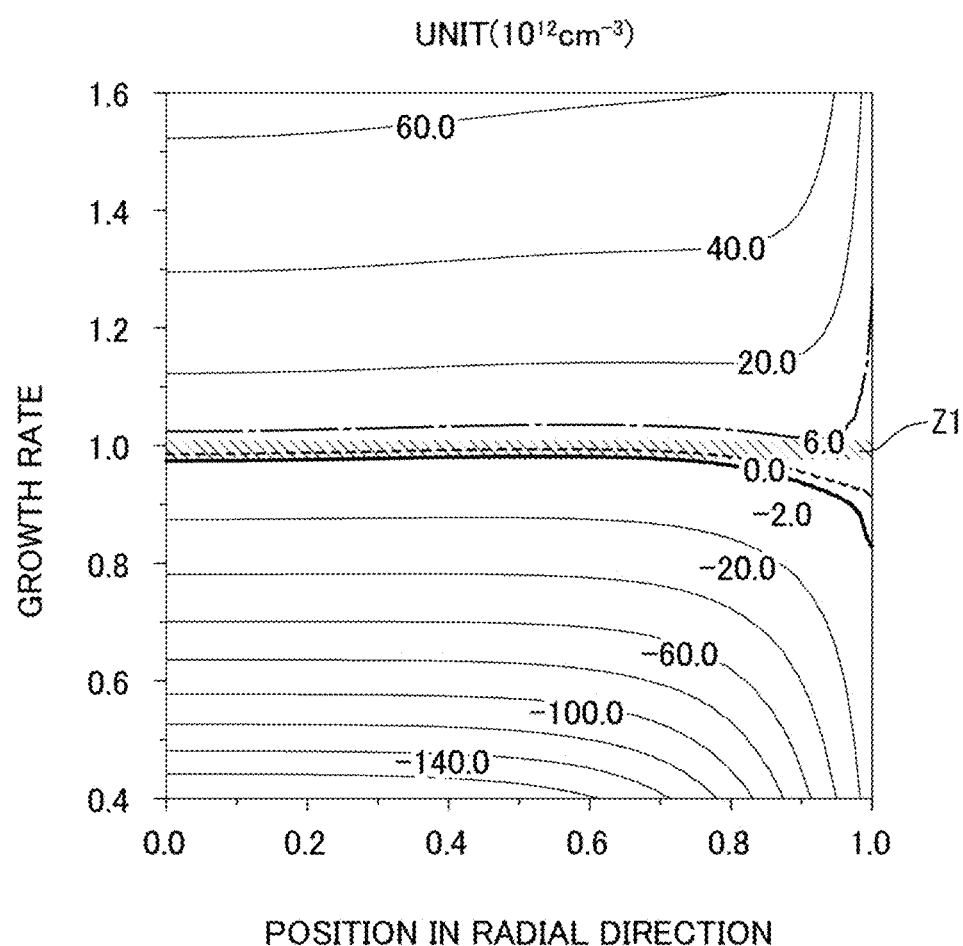

FIG. 5 is a graph showing an excess (a degree of supersaturation relative to a void) of vacancy or interstitial silicon relative to a thermal equilibrium concentration at 1000 degrees C. depending on a position in the monocrystalline silicon in a radial direction and a growth rate of the monocrystalline silicon according to the exemplary embodiment, where a positive value means a region with dominancy of a vacancy and a negative value means a region with dominancy of interstitial silicon.

Figure 6A:
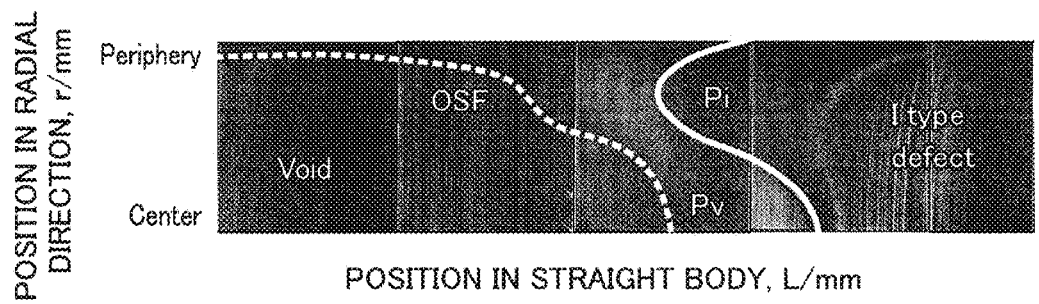

FIG. 6A is a photograph showing an actual point defect distribution depending on positions in the monocrystalline silicon in the radial direction and positions in a straight body of the monocrystalline silicon.

Figure 6B:
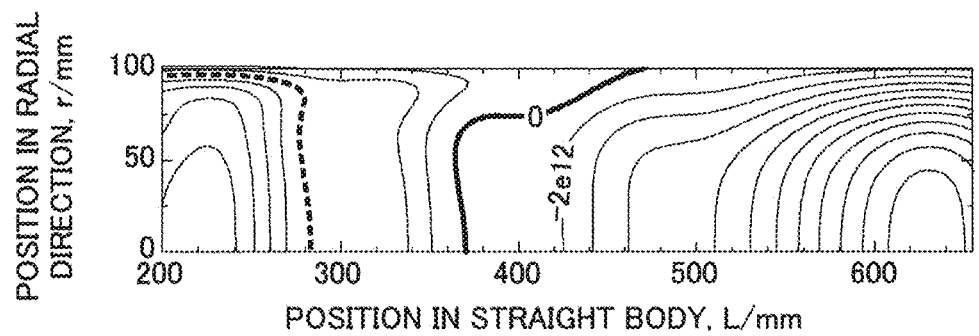

FIG. 6B schematically shows a conventionally calculated defect distribution depending on positions in the monocrystalline silicon in the radial direction and positions in the straight body of the monocrystalline silicon.

Figure 6C:
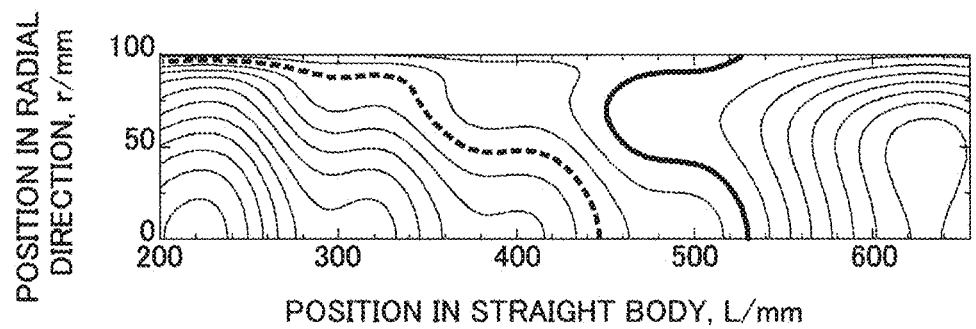

FIG. 6C schematically shows a defect distribution calculated according to the exemplary embodiment depending on the positions in the monocrystalline silicon in the radial direction and the positions in the straight body of the monocrystalline silicon.

Figure 7:
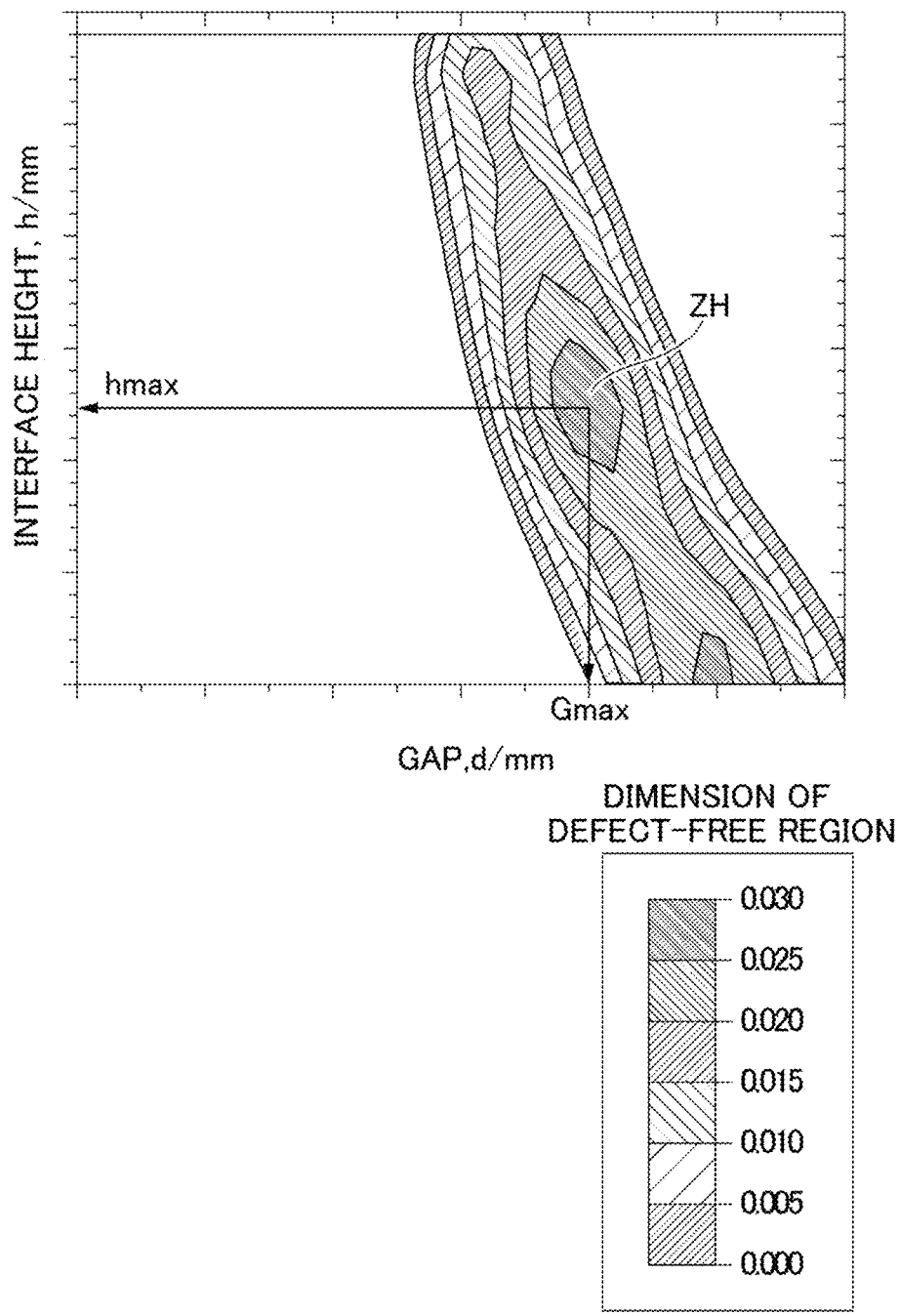

FIG. 7 is a two-dimensional map showing a defect-free region depending on a distance Gap between a heat shield plate and a liquid surface of a silicon melt and a solid-liquid interface height h according to the exemplary embodiment.

Figure 8:
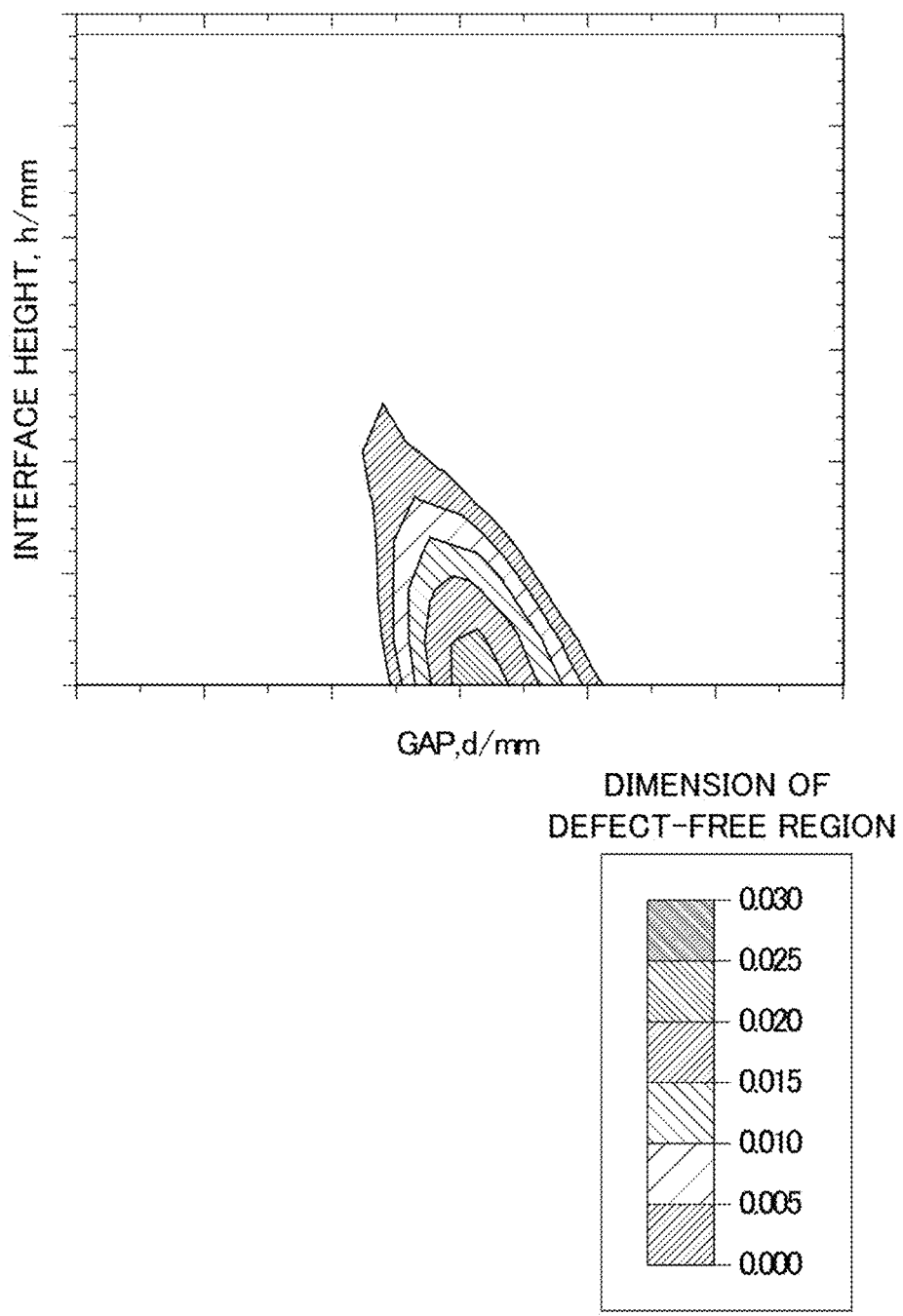

FIG. 8 is a two-dimensional map showing a defect-free region depending on a distance Gap between the heat shield plate and a surface of a silicon melt and the solid-liquid interface height h with a change in a hot zone according to the exemplary embodiment.

DESCRIPTION OF EMBODIMENT(S)

[1] A Configuration of a Monocrystalline Silicon Pull-Up Apparatus 1

Figure 1:
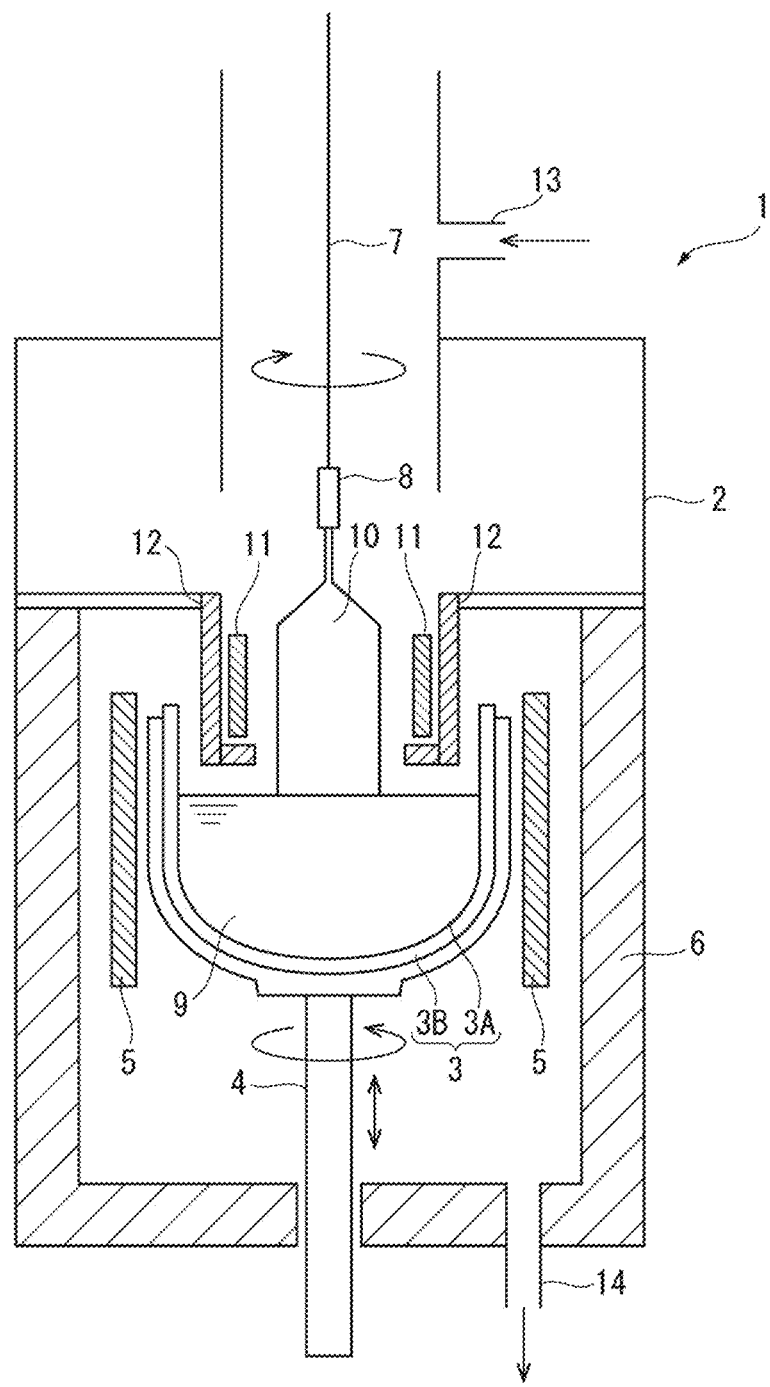

FIG. 1 schematically shows a configuration of a monocrystalline silicon pull-up apparatus 1, where a monocrystalline silicon growing method according to an exemplary embodiment of the invention is applicable. The pull-up apparatus 1 includes a chamber 2 defining an outer shell of the apparatus and a crucible 3 located at a center of the chamber 2.

The crucible 3, which has a two-layered structure of an inner quartz crucible 3A and an outer graphite crucible 3B, is fixed to an upper end of a rotatable and vertically movable support shaft 4.

A heater 5 (resistive heater) is located at the outside of the crucible 3 surrounding the crucible 3 and a heat insulation material 6 is located at the outside of the heater 5 along an inner surface of the chamber 2.

A pulling wire 7, such as a wire, is located above the crucible 3. The pulling wire 7 is configured to rotate at a predetermined speed in the opposite or same direction on the same axis as the support shaft 4. A seed crystal 8 is attached to a lower end of the pulling wire 7.

A cooler 11 is located in the chamber 2, The cooler 11 is a cylindrical cooling device surrounding a monocrystalline silicon 10, which is being currently grown above a silicon melt 9 in the crucible 3.

The cooler 11 is made of, for instance, a metal with excellent thermal conductivity (e.g., copper) and configured to be forcibly cooled by coolant flowing through the cooler 11. The cooler 11 serves to promote cooling of the currently grown monocrystalline silicon 10 to control a temperature gradient in a direction along the pulling wire 7 at a center of the monocrystal and a periphery of the monocrystal.

Further, a cylindrical heat shield plate 12 is located covering outer circumferential surface and lower end surface of the cooler 11.

The heat shield plate 12 serves to: insulate the currently grown monocrystalline silicon 10 from high-temperature radiant heat from the silicon melt 9 in the crucible 3, the heater 5 and a side wall of the crucible 3; and reduce the heat transfer from the solid-liquid interface of the grown monocrystalline silicon 10 to the cooler 11 with a low temperature near a solid-liquid interface, or a crystal-growth interface, for the control of the temperature gradient in the direction along the pulling wire at the center of the monocrystal and the periphery of the monocrystal in conjunction with the cooler 11.

An upper portion of the chamber 2 is provided with a gas inlet 13 for introducing inert gas, such as Ar gas, into the chamber 2. A lower portion of the chamber 2 is provided with an exhaust outlet 14 for exhausting gas in the chamber 2 drawn by driving a vacuum pump (not shown).

The inert gas introduced into the chamber 2 through the gas inlet 13 flows downward between the currently grown monocrystalline silicon 10 and the cooler 11 and passes through a space between the lower end of the heat shield plate 12 and a surface of the silicon melt 9. The inert gas then flows toward the outside of the heat shield plate 12 and the outside of the crucible 3 and flows downward at the outside of the crucible 3 to be exhausted through the exhaust outlet 14.

In growing the monocrystalline silicon 10 with the use of the pull-up apparatus 1, the silicon melt 9 is formed by melting a solid material (e.g., polycrystalline silicon) charged in the crucible 3 by heating with the heater 5 while a pressure-reduced inert gas atmosphere is maintained in the chamber 2. When the silicon melt 9 is formed in the crucible 3, the pulling wire 7 is moved downward so that the seed crystal 8 is immersed in the silicon melt 9. The pulling wire 7 is then gradually pulled up while rotating the crucible 3 and the pulling wire 7 in a predetermined direction, thereby growing the monocrystalline silicon 10 as being continuous from the seed crystal 8.

In growing a monocrystalline silicon with the use of the pull-up apparatus 1, respective optimal values of a solid-liquid interface height h between a meniscus line of the silicon melt 9 and the solid-liquid interface of the monocrystalline silicon and of a distance Gap between the surface of the silicon melt 9 and the heat shield plate 12 are calculated. Specifically, a monocrystalline silicon pulling condition calculation program based on a flowchart shown in FIG. 2 is executed by computer to calculate the respective optimal values of the solid-liquid interface height h and the distance Gap between the surface of the silicon melt 9 and the heat shield plate 12 to pull up the monocrystalline silicon 10.

Figure 2:
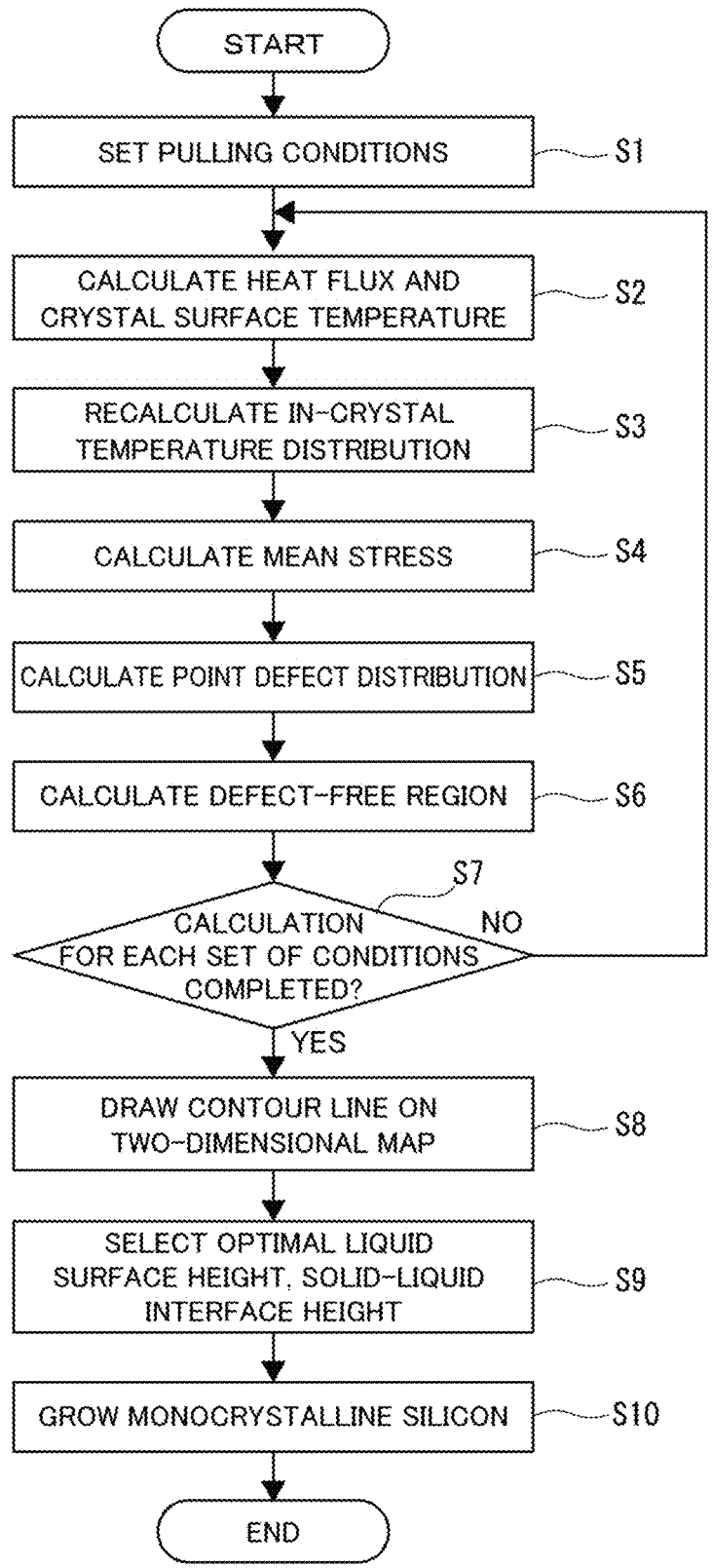
FIG. 2 is a flowchart showing a process of executing a piffling condition calculation program according to the exemplary embodiment.

As shown in FIG. 2, specific steps of calculation by computer include: setting a plurality of sets of pulling conditions by changing the distance Gap between the surface of the silicon melt 9 and the heat shield plate 12 and the solid-liquid interface height h (Step S1); calculating a heat flux and a crystal surface temperature for each set of pulling conditions (Step S2), calculating an in-crystal temperature distribution for each set of pulling conditions (Step S3); calculating a mean stress for each set of pulling conditions (Step S4), calculating a point defect distribution for each set of pulling conditions (Step S5), and calculating a defect-free region for each set of pulling conditions (Step S6).

After completion of the calculation of the respective defect-free regions for all the sets of pulling conditions (Step S7), contour lines representing the defect-free regions are drawn on a two-dimensional map, which is defined by the distance Gap between the surface of the silicon melt 9 and the heat shield plate 12 and the solid-liquid interface height h, based on respective calculated dimensions of the defect-free regions in a pulling direction of the monocrystalline silicon (Step S8).

With reference to the map made as described above, the respective optimal values of the distance Gap between the surface of the silicon melt 9 and the heat shield plate 12 and of the solid-liquid interface height h are selected that provide the maximum defect-free region (Step S9).

Finally, the heat shield plate 12 is set at a height of the selected value of the distance Gap between the surface of the silicon melt 9 and the heat shield plate 12, the solid-liquid interface height h is set by adjusting, for instance, a crystal rotation speed, a rotation speed of the crucible 3, and a magnetic field intensity, and the growth of the monocrystalline silicon 10 is then started (Step S10).

The steps of calculation will be described in detail below.

[2] Setting of the Pulling Conditions (Step S1)

First, the plurality of sets of pulling conditions are set by setting each of the distance Gap between the surface of the silicon melt 9 and the heat shield plate 12 and of the solid-liquid interface height h to a plurality of different values. Specifically, seven levels of the distance Gap between the surface of the silicon melt 9 and the heat shield plate 12 and seven levels of the solid-liquid interface height h are determined, thus providing 49 (7×7=49) sets of pulling conditions. It should be noted that the respective levels of the distance Gap between the surface of the silicon melt 9 and the heat shield plate 12 and of the solid-liquid interface height h can be determined as desired. The solid-liquid interface height h is changed as needed in view of, for instance, the crystal rotation speed, the rotation speed of the crucible 3, and the magnetic field intensity. When the setting of the solid-liquid interface height h is unknown, the solid-liquid interface height h may be in a range from the diameter of the monocrystalline silicon 10 (mm)/(−20) to the diameter of the monocrystalline silicon 10 (mm)/10.

Additionally, a geometry level of a hot zone may be determined taking into consideration the shape of the heat shield plate 12 and the shapes and/or position of the cooler 11.

[3] Calculation of Heat Flux q (W/m²) and Crystal Surface Temperature T(K) by Global Heat Transfer Analysis (Step S2)

A heat flux q (W/m²) and a crystal surface temperature T(K) in the pull-up apparatus 1 are calculated by global heat transfer analysis. The thermal flow analysis program CGSim manufactured by STR Japan K.K. enables a computer to calculate the heat flux q (W/m²) and the crystal surface temperature T(K).

Specifically, CGSim is configured to calculate the heat flux q (W/m²) and the crystal surface temperature T(K) by equations (2) to (9) below.

Equation 2

$$\frac{\partial \rho}{\partial t} + \nabla \cdot (\rho \vec{u}) = 0 \tag{2}$$

Equation 3

$$\frac{\partial (\rho \vec{u})}{\partial t} + (\vec{u} \cdot \nabla) \rho \vec{u} = -\nabla p + \nabla \cdot \tau + (\rho - \rho_0)\vec{g} + \vec{j} \times \vec{B} + S_u \tag{3}$$

Equation 4

$$\frac{\partial (\rho c_p T)}{\partial t} + \nabla \cdot (\rho c_p \vec{u} T) = \nabla \cdot (\lambda_{eff} \nabla T) - \nabla \cdot \vec{q}_{rad} + S_T \tag{4}$$

Equation 5

$$\nabla \cdot (\sigma \nabla \Phi) = \nabla \cdot (\sigma \cdot (\vec{u} \times \vec{B})) \tag{5}$$

Equation 6

-continued $$\frac{\partial(\rho\phi_1)}{\partial t} + \nabla \cdot (\rho u \phi_i) = \nabla \cdot (D_{\phi_i eff}(\nabla \phi)_i) + S_{\phi_i} \quad (6)$$

Equation 7

$$\rho = \frac{p_0 m}{R_g T_1} \quad (7)$$

Equation 8

$$\tau_{ij} = \mu_{eff}\left(\frac{\partial u_i}{\partial x_j} + \frac{\partial u_j}{\partial x_i}\right) - \frac{2}{3}\mu_{eff}\delta_{ij}\nabla \cdot \vec{u} \quad (8)$$

Equation 9

$$\vec{J} = \sigma(-\nabla\Phi + \vec{u} \times \vec{B}) \quad (9)$$

In the above equations,
ρ: density
$\rho_0$: reference density
vector μ: pulling velocity
τ: stress tensor
vector g: gravity vector
$\mu_{eff}=\mu_{molecular}+\mu_t$: effective dynamic viscosity coefficient (sum of molecular viscosity and turbulent viscosity)
$c_p$: specific heat
T: temperature
$\varphi_i$: ith passive species
$\lambda_{eff}$: effective thermal conductivity A specific example of calculation of the heat flux q(W/m²) and the crystal surface temperature T(K) is explained in detail in:

Global modelling of heat transfer in crystal growth furnaces F. DUPRET, P. NICODEME, Y. RYCKMANS, P. WOUTERS, M. J. CROCHET Int. J. Heat Mass Transfer. Vol. 33 No. 9, pp. 1849-1871, 1990.

By performing Step S2, the distribution of the crystal surface temperature and the ambient heat flux of the monocrystalline silicon 10 are determined.

[4] Recalculation of the In-Crystal Temperature Distribution of the Monocrystalline Silicon 10 (Step S3)

After [3] calculation of the heat flux q (W/m²) and the crystal surface temperature T(K) of the pull-up apparatus 1, a reference temperature Tref(K) given by an equation (10) below and the geometry of the solid-liquid interface are defined as boundary conditions and the in-crystal temperature distribution of the monocrystalline silicon 10 is recalculated using CGSim.

Equation 10

$$Tref = \sqrt[4]{T^4 - \frac{q}{\varepsilon\sigma}} \quad (10)$$

In the above equation,
ε=0.55: emissivity of the monocrystalline silicon
σ=5.67×10⁻⁸ (W/m²/K⁴): Stefan-Boltzmann coefficient Assuming that the monocrystalline silicon 10 has a symmetric temperature distribution with respect to the pulling wire 7 and is in a steady state with neither generation nor loss of heat in the monocrystalline silicon 10, the in-crystal temperature distribution of the monocrystalline silicon 10 can be calculated by solving a thermal conduction equation in the form of an equation (11) based on a cylindrical coordinate system (r, θ, z).

Equation 11

$$\frac{\partial}{\partial r}(\rho CruT) + \frac{\partial}{\partial z}(\rho CrwT) = \frac{\partial}{\partial r}\left(\lambda r \frac{\partial T}{\partial r}\right) + \frac{\partial}{\partial z}\left(\lambda r \frac{\partial T}{\partial z}\right) \quad (11)$$

It should be noted that the in-crystal temperature distribution T(K) is a variable and ρ (density), C (heat capacity), λ (thermal conductivity) are physical properties. Further, velocity vector V=(u, v, w), where u, v are given by equations (12), (13) below, respectively, Equation 12

$$u = -\frac{1}{r}\frac{\partial\phi}{\partial z} \quad (12)$$

$$w = \frac{1}{r}\frac{\partial\phi}{\partial r} \quad (13)$$

It should be noted that only the pulling velocity v of the monocrystalline silicon 10 may be taken into consideration. In this case, the equations (12) and the (13) can be easily solved with u=0 and w=v₀, so that the respective solutions of these equations may be given in advance using an equation (14) below.

Equation 13

$$\phi = \frac{1}{2}r^2 v_0 \quad (14)$$

The in-crystal temperature distribution T of the monocrystalline silicon 10 is calculated by solving the thermal conduction equation in the form of the equation (11) based on the reference temperature Tref given by the equation (10) and the boundary conditions for the given geometry of the solid-liquid interface.

Figure 3:
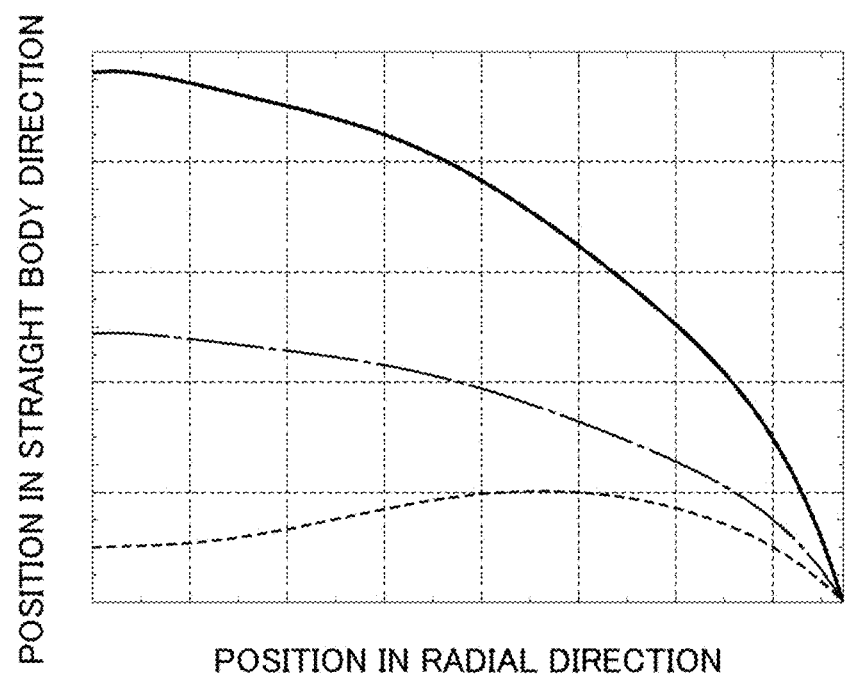
FIG. 3 is a graph showing an in-crystal temperature distribution of a monocrystalline silicon according to the exemplary embodiment.

By performing Step S3, the in-crystal temperature distribution of the monocrystalline silicon 10 is determined as show in FIG. 3.

[5] Calculation of a Mean Stress Applied in the Pulling Direction in the Monocrystalline Silicon 10 (Step S4)

A mean stress applied in the pulling direction in the monocrystalline silicon 10 can be calculated using the structure analysis software ABAQUS. It should be noted that a variety of structure analysis methods such as finite element method, finite volume method, and finite different method are usable.

Physical properties represented by equations (15) to (20) are usable for the calculation.

Equation 14

$$\left(\frac{1}{C_{11}}\right)\frac{dC_{11}}{dT} = -9.4 \times 10^{-5}(1/K) \quad (15)$$

$$\left(\frac{1}{C_{12}}\right)\frac{dC_{12}}{dT} = -9.8 \times 10^{-5}(1/K) \quad (16)$$

$$\left(\frac{1}{C_{44}}\right)\frac{dC_{44}}{dT} = -8.3 \times 10^{-5}(1/K) \quad (17)$$

Equation 15

$$\text{shear modulus} \quad \mu_R = \left(S_{44}^1 + \frac{4}{5}J\right)^{-1} \quad (18)$$

$$\text{Poisson's ratio:} \quad \nu_R = \left(-S_{12}^1 - \frac{J}{5}\right)\left(S_{11}^1 - \frac{2J}{5}\right)^{-1} \quad (19)$$

$$\text{Young's modulus} \quad E_R = \left(S_{11}^1 - \frac{2}{5}J\right)^{-1} \quad (20)$$

By performing Step S4, the distribution of the mean stress along the pulling direction in the monocrystalline silicon 10 is determined as shown in FIG. 4. Numerical values in FIG. 4 represent mean stress values (au), among which a positive value represents a tensile stress and a negative value represents a compression stress.

[6] Calculation of a point defect distribution in the pulling direction in the monocrystalline silicon 10 (Step S5)

A defect distribution in the monocrystalline silicon 10 can be calculated based on the in-crystal temperature distribution T, which is calculated in [4], and the mean stress in the pulling direction in the monocrystalline silicon 10, which is calculated in [5], using equations (21) to (25) as basic equations.

Equation 16

$$J_{I,V} = -D_{I,V}\nabla C_{I,V} - \frac{D_{I,V}C_{I,V}Q_{I,V}^*}{K_B T^2}\nabla T \quad (21)$$

Equation 17

$$\frac{\partial C_{I,V}}{\partial t} = -\nabla J_{I,V} - V\frac{\partial C_{I,V}}{\partial z} - K_{IV}(C_V C_I - C_V^{eq} C_I^{eq}) \quad (22)$$

Equation 18

$$K_{IV} = 4\pi(D_V + D_I)a_c \cdot \exp\left(-\frac{\Delta G_{IV}}{k_B T}\right) \quad (23)$$

$$C_V^{eq} = C_{V,0}\exp\left(\frac{E_v^f + a_v\sigma \text{ mean}}{-k_B T}\right) \quad (24)$$

$$C_I^{eq} = C_{I,0}\exp\left(\frac{E_v^f + a_I\sigma \text{ mean}}{-k_B T}\right) \quad (25)$$

The equation (21) represents a diffusion flux under the influence of the temperature gradient of the monocrystalline silicon 10. The first term of the equation (22) is a diffusion term representing a change in point defect concentration due to diffusion and the second term is an advective term representing an effect of concentration shift caused as the monocrystalline silicon 10 is pulled up (moved). The third term of the equation (22) is a term of annihilation between void and interstitial silicon.

The equation (23) represents a reaction constant of annihilation, where $\Delta G_{IV}$ denotes a barrier energy of annihilation and $a_c$ denotes a critical distance for occurrence of annihilation, A concentration of currently growing point defects can be calculated by solving the equation (22) under boundary conditions where a point defect concentration of a free surface of the monocrystalline silicon 10 is a thermal equilibrium concentration at a temperature at the position.

It should be noted that whether a point defect concentration distribution predicted from a calculation model matches an experiment depends on the setting of the following 12 parameters, $C_{Vmp}$, $E_{Vmp}^f$, $C_{Imp}$, $E_{Imp}^f$: thermal equilibrium ratio and formation energy at the melting point $D_{Vmp}$, $E_{Vmp}^m$, $D_{Imp}$, $E_{Imp}^m$: diffusion coefficient and activation energy at the melting point $\Delta H_{VI}$, $\Delta S_{VI}$: enthalpy and entropy of the barrier energy $\Delta G_{IV}$ of annihilation $Q^{I*}$, $Q^{V*}$: heat of transport $a_v$, $a_I$: stress coefficient By performing Step S5, a point defect distribution depending on a position in the monocrystalline silicon 10 in the radial direction and a growth rate of the monocrystalline silicon 10 is determined.

FIG. 6A is an X-ray photograph showing an in-crystal point defect distribution taken after a heat treatment at 780 degrees C.×3 hours and a heat treatment at 1000 degrees C.×16 hours, FIGS. 6B and 6C each show contour lines representing degrees of supersaturation relative to a void.

Assuming that an actual point defect distribution is as shown in FIG. 6A, the calculated point defect distribution would greatly differ from the actual point defect distribution as shown in FIG. 6B without consideration of the reference temperature Tref and the stress effect.

In contrast, since the reference temperature Tref and the stress effect are taken into consideration according to the exemplary embodiment, the point defect distribution can be calculated to be very close to the actual point defect distribution as shown in FIG. 6C.

[7] Calculation of the Defect-Free Region in the Monocrystalline Silicon 10 (Step S6)

The defect-free region in the monocrystalline silicon 10 is calculated based on the concentration distribution of point defects in the pulling direction in the monocrystalline silicon 10 determined in [6]. A region with a predetermined threshold of point defect concentration distribution or less is defined as the defect-free region. Specifically, in the exemplary embodiment, a region including an interstitial defect region of −0.2129×10$^{13}$/cm$^3$ or less and a void defect region of 0.5787×10$^{13}$/cm$^3$ or less is defined as the defect-free region, As a result of defining the defect-free region through the calculation of defect-free region(s) in the monocrystalline silicon 10, distribution of the defect-free region on the basis of positions in the monocrystalline silicon 10 in the radial direction is defined as shown by a region Z1 shown in FIG. 5.

[8] Drawing of Contour Lines on the Two-Dimensional Map (Step S8) and Selection of the Optimal Distance Gap Between the Surface of the Silicon Melt 9 and the Heat Shield Plate 12 and the Optimal Solid-Liquid Interface Height h (Step S9)

When the dimension of the defect-free region is determined for each set of pulling conditions, a contour line of the defect-free region is drawn on the two-dimensional map defined by the distance Gap between the surface of the silicon melt 9 and the heat shield plate 12 and the solid-liquid interface height h as shown in FIGS. 7 and 8 (Step S8).

Subsequently, with reference to the contour lines shown in FIG. 7, a value of the distance Gap between the surface of the silicon melt 9 and the heat shield plate 12 and a value of the solid-liquid interface height h that provide the maximum defect-free region are selected (Step S9). Specifically, an optimal distance Gmax between the surface of the silicon melt 9 and the heat shield plate 12 and an optimal solid-liquid interface height hmax are selected based on a point in a maximum defect-free region Z1.

Finally, after setting the distance Gap between the surface of the silicon melt 9 and the heat shield plate 12 to the distance Gmax, adjusting, for instance, the crystal rotation speed of the monocrystalline silicon 10, the rotation speed of the crucible 3, and the magnetic field intensity, and setting the solid-liquid interface height h to hmax, the growth of the monocrystalline silicon 10 is started in the pull-up apparatus 1 (Step S10).

Further, by comparing respective maximum values of the contour lines of the defect-free regions for possible hot zones on the two-dimensional map defined by the distance Gap between the surface of the silicon melt 9 and the heat shield plate 12 and the solid-liquid interface height h as shown in FIGS. 7 and 8, it can be determined whether the defect-free region can be increased by changing the hot zone.

The invention claimed is:

1. A computer-readable medium storing a code of monocrystalline silicon pulling condition calculation program for determining, for growth of a monocrystalline silicon, an optimal value of a solid-liquid interface height h of a solid-liquid interface and an optimal value of a distance Gap between a heat shield plate of a pull-up apparatus for the monocrystalline silicon and a surface of a silicon melt, the program being configured, when being read and run by a computer, to enable the computer to perform the steps of:

setting a plurality of sets of pulling conditions based on a plurality of values of the solid-liquid interface height h and a plurality of values of the distance Gap between the heat shield plate and the surface of the silicon melt;

performing, for each set of the pulling conditions, the steps of: calculating a heat flux q (W/m$^2$) and a crystal surface temperature T(K) in the pull-up apparatus by global heat transfer analysis; defining a reference temperature Tref(K) and a geometry of the solid-liquid interface as boundary conditions, the reference temperature Tref(K) being given by an equation (1) below based on the calculated heat flux q(W/m$^2$) and crystal surface temperature T(K); recalculating an in-crystal temperature distribution in the monocrystalline silicon based on the defined boundary conditions; calculating a mean stress σmean caused in the monocrystalline silicon by structure analysis based on the recalculated in-crystal temperature distribution in the monocrystalline silicon; calculating a defect distribution in a pulling n in the monocrystalline silicon based on the calculated mean stress σmean in the monocrystalline silicon and the recalculated in-crystal temperature distribution in the monocrystalline silicon; and determining a defect-free region in the pulling direction in the monocrystalline silicon based on the calculated defect distribution in the pulling direction in the monocrystalline silicon;

drawing a contour line of the defect-free region on a two-dimensional map based on a dimension of the defect-free region in the pulling direction in the monocrystalline silicon for each set of the pulling conditions, the two-dimensional snap being defined by the distance Gap between the heat shield plate and the surface of the silicon melt and the solid-liquid interface height h; and selecting, based on the contour line drawn on the two-dimensional map, one of the values of the solid-liquid interface height h and one of the values of the distance Gap between the heat shield plate and the surface of the silicon melt that maximize the dimension of the defect-free region, wherein the mean stress mean is given by σmean=T+σrr+σθθ+σzz)/3, where σrr, σθθ, and σzz represent stress components perpendicular to r-plane, θ-plane, and z-plane, respectively, $$Tref = \sqrt[4]{T^4 - \frac{q}{\varepsilon\sigma}} \quad (1)$$

where
ε=0.55: emissivity of the monocrystalline silicon, and
σ=5.67×10$^{-8}$ (W/m$^2$/K$^4$): Stefan-Boltzmann coefficient.

2. A hot zone improvement method for a monocrystalline silicon, the method comprising:

reading the computer-readable medium storing a code of the monocrystalline silicon pulling condition calculation program according to claim 1 by a computer and running the monocrystalline silicon pulling condition calculation program by the computer to calculate the pulling conditions of the monocrystalline silicon for each of respective geometries of a plurality of hot zones;

calculating the defect-free region corresponding to each of the hot zones; and selecting optimal one of the hot zones that provides a maximum defect-free region.

3. A monocrystalline silicon growing method for growing a monocrystalline silicon, the method comprising:

reading the computer-readable medium storing a code of the monocrystalline silicon pulling condition calculation program according to claim 1 by a computer and running the monocrystalline silicon pulling condition calculation program by the computer to calculate the pulling conditions of the monocrystalline silicon; and pulling up the monocrystalline silicon based on the calculated optimal value of the solid-liquid interface height h and optimal value of the distance Gap between the heat shield plate and the surface of the silicon melt.

4. A monocrystalline silicon growing method for growing a monocrystalline silicon, the method comprising:

based on the hot zone improvement method of a monocrystalline silicon according to claim 2, calculating the pulling conditions of the monocrystalline silicon for each of the respective geometries of the plurality of hot zones; and pulling up the monocrystalline silicon based on the calculated optimal value of the solid-liquid interface height h and optimal value of the distance Gap between the heat shield plate and the surface of the silicon melt.

* * * * *